United States Patent
Driediger et al.

(10) Patent No.: US 7,154,305 B2
(45) Date of Patent: Dec. 26, 2006

(54) PERIODIC ELECTRICAL SIGNAL FREQUENCY MONITORING SYSTEMS AND METHODS

(75) Inventors: Steve Driediger, Kanata (CA); Dion Pike, Stittsville (CA)

(73) Assignee: Alcatel, Paris (FR)

( * ) Notice: Subject to any disclaimer, the term of this patent is extended or adjusted under 35 U.S.C. 154(b) by 56 days.

(21) Appl. No.: 11/024,332

(22) Filed: Dec. 22, 2004

(65) Prior Publication Data

US 2006/0132190 A1    Jun. 22, 2006

(51) Int. Cl.
*G01R 23/02* (2006.01)

(52) U.S. Cl. .............................. 327/47; 327/48; 326/96

(58) Field of Classification Search ............... None
See application file for complete search history.

(56) References Cited

U.S. PATENT DOCUMENTS

| | | | |
|---|---|---|---|
| 4,321,547 A | | 3/1982 | Pickard et al. |
| 5,220,295 A | | 6/1993 | Glover et al. |
| 5,499,393 A | * | 3/1996 | Fukui .......................... 455/264 |
| 5,696,462 A | * | 12/1997 | Maturi et al. ................ 327/151 |
| 6,259,290 B1 | | 7/2001 | Takada et al. |
| 6,314,150 B1 | * | 11/2001 | Vowe .......................... 375/374 |
| 6,320,469 B1 | | 11/2001 | Friedberg et al. |
| 6,707,329 B1 | | 3/2004 | Shenoi |
| 6,760,394 B1 | | 7/2004 | Cao et al. |

OTHER PUBLICATIONS

IBM Technical Disclosure Bulletin, "Extendable Digital Frequency Comparator Using Standard Logic," Bulletin, vol. 37, No. 6A, Jun. 1, 1994, pp. 347-348, XP000455800, ISSN: 0018-8689 *the whole document*.
European Patent Office, European Search Report, May 24, 2006.
European Patent Office, Foreign Application Search Report, Mar. 1, 2006.

* cited by examiner

*Primary Examiner*—Timothy P. Callahan
*Assistant Examiner*—An T. Luu
(74) *Attorney, Agent, or Firm*—Barnes & Thornburg LLP

(57) ABSTRACT

Systems and methods for monitoring frequencies of periodic electrical signals are disclosed. According to one technique, a first and second counters are respectively clocked by a first periodic electrical signal to be monitored and a second periodic electrical, and a threshold detector resets one of the counters when a count of the other counter crosses a reset threshold and determines whether a frequency error has occurred based on whether a count of the one of the counters crosses an alarm threshold. Another technique according to an embodiment of the invention also involves clocking counters with respective periodic electrical signals, although error detection is based on whether the counts of the counters cross respective associated thresholds in other than a particular sequence with respect to each other.

17 Claims, 10 Drawing Sheets

PERIODIC ELECTRICAL SIGNAL FREQUENCY MONITORING SYSTEMS AND METHODS

FIELD OF THE INVENTION

This invention relates generally to monitoring periodic electrical signals and, in particular, to detecting frequency errors or failures.

BACKGROUND

In electronic devices and systems, proper device or system operation is often dependent, at least in part, upon correct timing. Typically, a timing module which includes such components as a clock source and counters or dividers provides timing or clock signals to other electronic components. In the event that the clock signals are not at an expected frequency or within a particular tolerance thereof, then the components which rely on the clock signals, and thus the electronic device or system, might not operate as intended.

It is therefore generally desirable to provide for effective monitoring of the frequency of clock signals used in electronic equipment. Although clock signals represent perhaps the most common type of periodic electrical signal for which accurate frequencies are critical, there may be other types of periodic electrical signal for which effective frequency monitoring is important.

U.S. Pat. No. 6,707,329, issued on Mar. 16, 2004 and entitled "CLOCK RECOVERY AND DETECTION OF RAPID PHASE TRANSIENTS", describes a typical example of comparing a subject clock signal to a reference signal to determine whether the subject clock signal is within a specified frequency tolerance of the reference signal. According to the above patent, a high and a low counter are driven by the subject clock signal when its phase lags or leads the reference signal, respectively. Each counter has a corresponding threshold, the crossing of which by the counter's count causes an alarm to be triggered. The techniques described in the above patent, however, are intended primarily for clock recovery and phase transient detection, and thus might not be feasible for implementation for the purposes of periodic electrical signal frequency monitoring in general. In addition, these techniques require that one input signal, which is not monitored itself, be used as a reference signal for another input signal.

SUMMARY OF THE INVENTION

In view of the foregoing, one object of embodiments of the invention is to provide for detection of frequency variations or loss of periodic electrical signals.

Another object of some embodiments of the invention is to provide for detection of frequency variations or losses without designating or using any particular periodic electrical signal as a reference signal.

According to one aspect of the invention, a system for monitoring a frequency of a periodic electrical signal is provided. The system includes a first counter clocked by a first periodic electrical signal to be monitored, a second counter clocked by a second periodic electrical signal, and a threshold detector. The threshold detector resets one of the first counter and the second counter when a count of the other of the first counter and the second counter crosses a reset threshold, and determines whether a frequency error has occurred in the first periodic electrical signal based on whether a count of the one of the first counter and the second counter crosses an alarm threshold.

A method of monitoring a frequency of a periodic electrical signal is also provided, and include counting pulses of a first periodic electrical signal to be monitored to generate a first count, counting pulses of a second periodic electrical signal to generate a second count, resetting one of the first count and the second count, to thereby restart the one of the first count and the second count, responsive to the other of the first count and the second count crossing a reset threshold, and determining whether a frequency error has occurred in the first periodic electrical signal based on whether the one of the first count and the second count crosses an alarm threshold.

A further system for monitoring frequencies of periodic electrical signals in accordance with another aspect of the invention includes a plurality of counters, clocked by respective periodic electrical signals, and a threshold detector. Each of the plurality of counters has a respective associated threshold. The threshold detector detects, for each of the plurality of counters, crossing of each threshold associated with the counter by the count of the counter, and determines whether a frequency error has occurred based on whether the counts of the plurality of counters cross their respective thresholds in other than a particular sequence with respect to each other.

A related method of monitoring frequencies of periodic electrical signals includes counting pulses of a plurality of periodic electrical signals to generate a respective plurality of counts, the plurality of counts having respective associated thresholds, detecting a crossing, by each of the plurality of counts, of each threshold associated with the count, and determining whether a frequency error has occurred based on whether the counts cross their respective thresholds in other than a particular sequence with respect to each other.

Other aspects and features of embodiments of the present invention will become apparent to those ordinarily skilled in the art upon review of the following description of specific illustrative embodiments of the invention.

BRIEF DESCRIPTION OF THE DRAWINGS

Examples of embodiments of the invention will now be described in greater detail with reference to the accompanying drawings, in which.

DETAILED DESCRIPTION OF PREFERRED EMBODIMENTS

As discussed briefly above, effective frequency monitoring is generally desirable where the frequency of periodic electrical signals is important. A clock signal used in electronic equipment represents one type of periodic electrical signal for which an accurate and stable frequency is critical. Although frequency monitoring techniques are described herein in the context of clock signals and electronic equipment, it should be appreciated that the present invention is in no way limited to monitoring clock signals.

According to one embodiment of the invention, a master clock signal, illustratively a clock signal which is used by an "intelligent" integrated circuit such as a microprocessor, a network processor, a Digital Signal Processor (DSP), or a Field Programmable Gate Array (FPGA) in electronic equipment, is monitored using an independently generated secondary clock signal. Unlike some conventional frequency detection techniques, the secondary clock signal need not necessarily have substantially the same frequency as the master clock signal, and may be slower or faster than the master clock signal. In the former case, described in further detail below, the lower frequency secondary signal is used as a "watch-dog" for the higher frequency master clock signal.

A specific implementation of this technique uses each clock signal to clock a respective counter, with a count of the counter driven by the secondary clock signal preferably initiating an alarm signal and/or some other action when a predetermined threshold is crossed. A threshold may be considered as being "crossed" in either of two situations: when an associated count reaches but has not yet exceeded the threshold (i.e., count==threshold), or when the count exceeds the threshold (i.e., count>threshold). A combined threshold crossing option is also possible, in which a threshold is considered to be crossed when an associated count reaches or exceeds the threshold (i.e., and count>=threshold).

A count of the counter driven by the master clock signal initiates a reset of the secondary clock-driven counter upon crossing another predetermined threshold, thereby preventing the assertion of the alarm signal. If the master clock signal is lost, or its frequency is severely reduced, then the secondary clock-driven counter will cross its threshold. The alarm signal may cause an alarm condition to be indicated, without requiring use of the master clock signal, thereby allowing corrective action such as a processor activity switch to be taken. Generation of an alarm using the secondary clock signal instead of the master clock signal also avoids the generation of a master clock alarm in the event that the secondary clock signal is lost.

Figure 1:
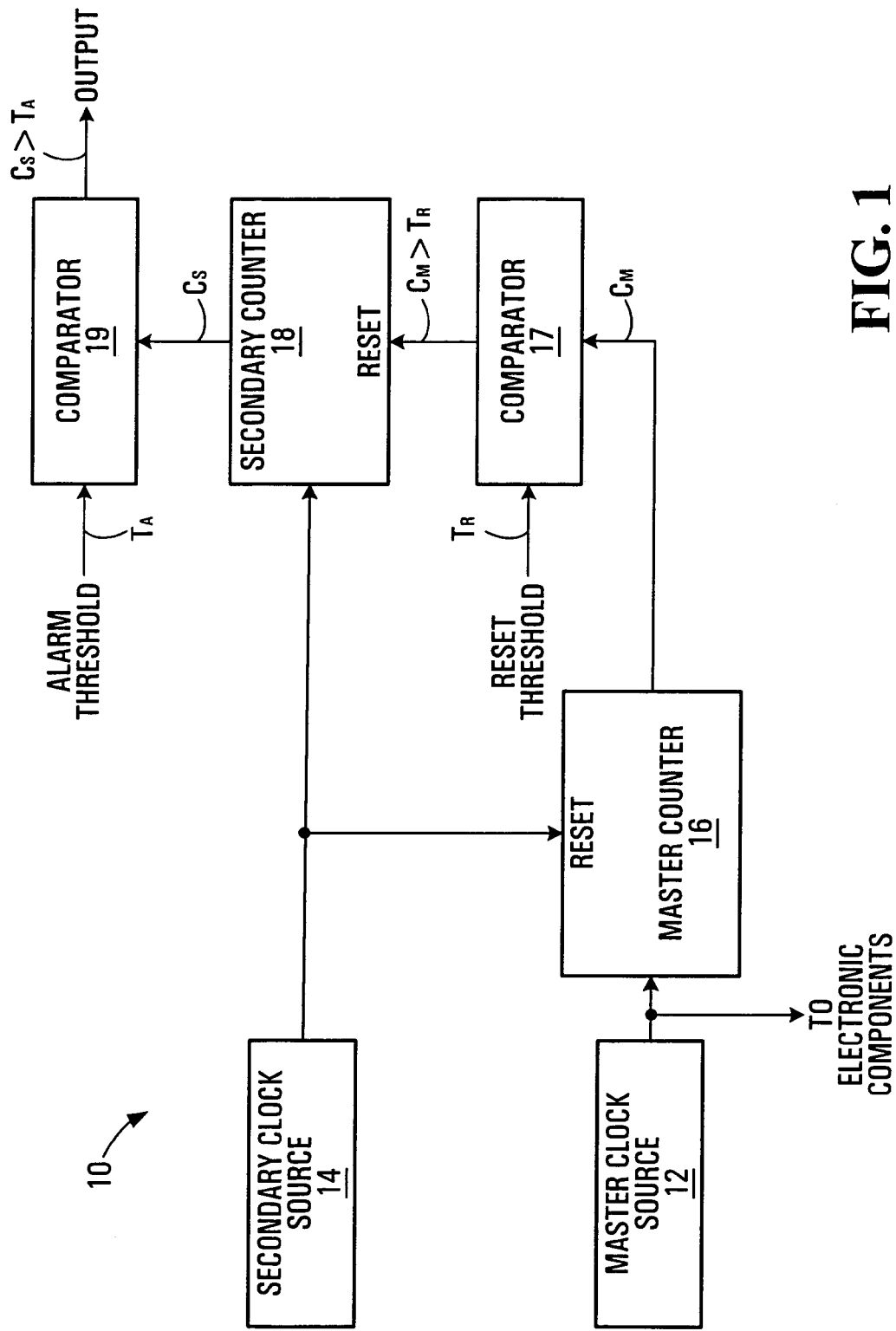
FIG. 1 is a block diagram of a frequency monitoring system in accordance with an embodiment of the invention.

FIG. 1 is a block diagram of a frequency monitoring system in accordance with the above embodiment of the invention. The frequency monitoring system 10 of FIG. 1 includes a master clock source 12 and a secondary clock source 14, a master counter 16 and a secondary counter 18, and comparators 17, 19. It should be appreciated that although the master and secondary clock sources 12, 14 have been shown in FIG. 1, a frequency monitoring system need not incorporate clock sources. In most implementations, it is expected that a frequency monitoring system will include inputs for receiving clock signals which are generated externally, illustratively by a timing system of electronic equipment in which the frequency monitoring system is implemented. Thus, a frequency monitoring system may either include, or likely in most cases have access to, clock sources or signals.

Various different implementations of the components shown in FIG. 1 will be apparent to those skilled in the art. For example, each clock source 12, 14, may include an oscillator, such as a crystal oscillator, as well as counters or dividers for generating multiple lower frequency clock signals from a single high-frequency oscillator output signal. An oscillator or clock signal may also be multiplied up using a Phase Locked Loop (PLL), for instance. In the case of the master clock source 12 as shown, and possibly also the secondary clock source 14, clock signals may be provided to other electronic components for use in normal operations of electronic equipment.

Those skilled in the art will also be familiar with many forms of counter which may be used in implementing the counters 16, 18. The comparators 17, 19 are similarly well known components which may be implemented in many different ways without departing from the present invention. Logic devices such as AND gates, for example, may be used in implementing the threshold detection function, described in detail below, of the comparators 17, 19.

Operation of the system of FIG. 1 will now be described in further detail in the context of an illustrative example scenario in which the secondary clock signal, which is generated independently from the master clock signal by the secondary clock source 14, is slower than the master clock signal and is used as a watch-dog for monitoring the faster master clock signal. It should be appreciated that this example is provided solely for the purposes of illustration and not to limit the scope of the invention in any way.

Frequency monitoring is accomplished in the system 10 using the two counters, namely the master counter 16 and the secondary counter 18, which are driven by respective clock signals from the master clock source 12 and the secondary clock source 14. The counters 16, 18 count pulses, or perhaps most often either rising or falling edges of clock pulses, of the master and secondary clock signals. Each time a count $C_M$ of the master counter 16 crosses a reset threshold $T_R$, the secondary counter 18 is reset.

In the system 10, the secondary clock from the secondary clock source 14 is used in some embodiments to reset the master counter 16, on each rising edge of the secondary clock for instance. Of course, those skilled in the art will appreciate that reset of the master clock counter 16 on each pulse of the secondary clock signal assumes that the secondary clock signal has a lower frequency than the master clock signal. Alternative reset mechanisms may be used for the master counter 16, depending upon the relative frequencies of the master and secondary clock signals, such as using a count value from the secondary counter 18 to reset the master counter 16.

For the illustrative example scenario of a slower secondary clock signal being used as a watch-dog for the faster master clock signal, the master counter 16 will normally cross the reset threshold $T_R$ before the secondary counter 18 crosses the alarm threshold $T_A$, which causes the secondary counter 18 to be reset. This effect is achieved by careful selection of the thresholds $T_R$ and $T_A$ based on the relative frequencies of the secondary and master clock signals. In one embodiment, the thresholds $T_R$ and $T_A$ are selected such that the master counter 16 crosses the threshold $T_R$ within one period of the secondary clock signal, provided the master clock signal is at or within some tolerance of its expected frequency.

After the secondary counter 18 is reset, the master counter 16 continues to count. In the system 10, the master counter 16 counts until it is reset by the secondary clock, illustratively by the rising edge thereof.

If generation of the master clock becomes faulty or some other condition affects the master clock signal such that its frequency is greatly reduced or it is no longer generated, then the secondary counter 18 is no longer reset at the same frequency and thus its count will begin to increase. When the count $C_S$ of the secondary counter 18 crosses the alarm threshold $T_A$, as detected by the comparator 19, an alarm output signal is preferably asserted.

Thus, the comparators 17, 19 and their interconnection with the counters 16, 18 may be considered an example implementation of threshold detection elements in a threshold detector which determines when the counters 16, 18 cross their thresholds and perform reset or alarm operations which are described in further detail below.

The alarm output signal indicates a frequency error such as a loss of master clock condition, and could be used, for example, to energize an alarm LED in an electronic device or system or an equipment shelf in which electronic equipment is mounted, or to trigger an activity switch to a redundant processor card in a protection group, without requiring the master clock signal. In telecommunication applications, the alarm threshold $T_A$ is preferably selected such that detection of a master clock fault condition and a protection switchover could be done within 50 ms. Where the secondary clock signal is generated independently of the master clock signal, these operations do not require the use of the master clock signal. However, it should be appreciated that the secondary clock signal is not necessarily needed to respond to such alarms in all embodiments.

Figure 2:
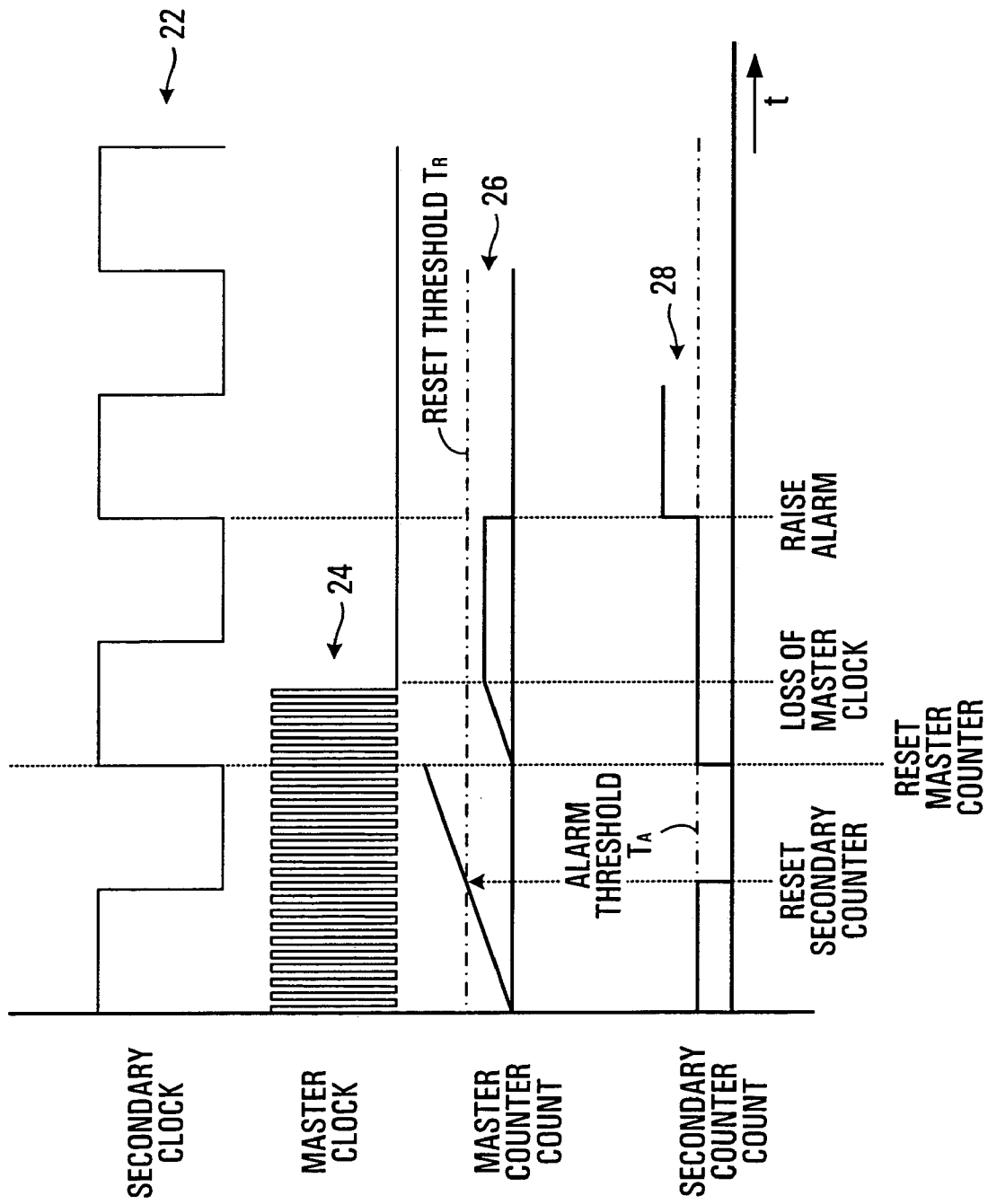
FIG. 2 is a timing diagram illustrating periodic electrical signals and the operation of the system of FIG. 1.

The operation of the system 10 is further represented in the timing diagram of FIG. 2, which illustrates the secondary clock signal at 22, the master clock signal at 24, the count $C_M$ of the master counter 16 at 26, and the count $C_S$ of the secondary counter 18 at 28. It will be apparent to those skilled in the art that time increases from left to right along the horizontal axis in FIG. 2, and that the signals are not necessarily drawn to scale for any specific units along the vertical axis.

As shown in FIG. 2, the master counter count 26 increases with pulses, rising edges, or falling edges of the master clock signal 24. For convenience, the master counter count 26 is shown as a linearly increasing signal, although it will be appreciated that the master counter count 26 would generally increase incrementally. When the master counter count 26 crosses the reset threshold $T_R$, the secondary counter, which had counted a pulse of the secondary clock signal at t=0, is reset.

The master counter continues to count, and its count 26 increases as shown, for a relatively short period of time until it is reset at the rising edge of the secondary clock signal 22. The rising edge is also counted by the secondary counter and accordingly the secondary counter count 28 is incremented. In the example of FIG. 2, the alarm threshold $T_A$ is set to one, and the system is configured to generate an alarm when the alarm threshold is crossed. As noted above, a threshold may be considered "crossed" either when an associated count reaches but has not yet exceeded the threshold or when the count exceeds the threshold. In FIG. 2, the alarm threshold represents the latter type of threshold, which is considered to be crossed only when it has been exceeded by the secondary counter count.

Following its reset at the rising edge of the secondary clock signal 22, the master counter begins counting at zero, and the master counter count 26 increases with each pulse or each rising or falling edge of the master clock signal 24. If the frequency of the master clock signal 24 decreases, or the master clock signal 24 is completely lost as shown in FIG. 2, then the secondary counter is not reset within the second period of the secondary clock signal 22, the second rising edge of the secondary clock signal 22 is counted by the secondary counter, and the secondary counter count 28 crosses the alarm threshold $T_A$. An alarm output signal is then generated and may be used, for example, to trigger corrective actions.

Many variations of the above example system 10 and the signal/threshold arrangement of FIG. 2 will be apparent to those skilled in the art. For example, an alarm threshold $T_A$ of one is shown in FIG. 2, and provides detection of a master clock signal failure within one cycle of the secondary clock signal. A common side effect of fast fault detection, however, is increased false detections and alarms. An alarm threshold $T_A$ of 2 would result in slower fault detection, within two cycles of the secondary clock signal, but would provide a level of debouncing, such that a relatively short master clock or counter fault would not cause an alarm output signal to be generated. Referring again to FIG. 1, if the master counter 16 were to stop counting for some reason but then recover after being reset on the rising edge of the secondary clock signal, then an alarm threshold $T_A$ of 2 in FIG. 2 would prevent the generation of the alarm output signal. A higher alarm threshold $T_A$ would similarly provide for recovery from a temporary interruption in the master clock signal.

Another variation of the embodiments of the invention described above relates to resetting the master counter 16. As an alternative to resetting the master counter 16 on every rising edge of the secondary clock signal, the master counter 16 could be allowed to wrap around its maximum count value, provided the master counter 16 could wrap around and again cross the reset threshold $T_R$ before the secondary counter 18 crosses the alarm threshold $T_A$.

Two types of threshold function, including "reach" and "exceed" functions, have been illustrated in FIG. 2 for illustrative purposes. The secondary counter is reset when the master counter count 26 reaches the reset threshold $T_R$, whereas an alarm is raised when the secondary counter count 28 exceeds the alarm threshold $T_A$. Any one of these threshold functions, or a different combination thereof, may be used to determine when an action is to be taken. References herein to crossing thresholds are intended to include either or both of these threshold reaching and exceeding functions, and should be interpreted accordingly.

The independence of generation of the secondary clock signal, although optional in some embodiments, is preferred in order to allow actions to be taken when a master clock signal fault or loss is detected.

The relative frequencies of the secondary and master clock signals is also subject to variation from the above example of a slower secondary clock signal and a faster master clock signal. Implementations of frequency monitoring techniques in which a monitored signal is slower than a secondary signal used in monitoring the signal will be readily apparent to those skilled in the art based on the disclosure of watch-dog techniques provided in the present application. Generally, the frequency of an independent clock source for the secondary clock signal may be multiplied or divided to obtain an appropriate frequency relationship between the secondary and master clock signals.

For example, embodiments of the invention in which the master counter is reset by the secondary clock signal are based on the secondary clock signal being slower than the master clock signal. However, the master counter could instead be reset based on the crossing of another threshold by the secondary counter count. In this case, the secondary clock signal could be faster than the master clock signal.

In addition, whereas the above embodiments of the invention relate to monitoring a master clock signal to detect a degradation in the master clock signal frequency or loss of the master clock signal, detection of an increase in the frequency of the master clock signal in a substantially similar manner will be apparent to any person skilled in the art. According to one possible implementation of this type of monitoring scheme, a master counter is reset when a secondary counter crosses a reset threshold, and an alarm signal is generated if the master counter crosses an alarm threshold. Thus, in different embodiments of the invention, either one of a master counter count and a secondary counter count may be used to detect a frequency error.

It should also be appreciated that the designation of the clock signals in FIGS. 1 and 2 as "master" and "secondary" are purely for illustrative purposes. A master clock signal is typically used to control substantially all processor operations in electronic equipment and therefore represents one potential application of the frequency monitoring techniques disclosed herein. However, embodiments of the invention may also be applied to other types of signals.

Detection of abnormalities in the frequency of a periodic electrical signal has been described in detail above. Responsive to such a detection, one or more different actions may be taken. For instance, a controller or redundant equipment in a protection system, a control card or a redundant circuit card in a communication equipment rack for instance, may be notified when a master clock signal failure condition is detected.

In the preceding example, recovery operations are automatically initiated responsive to the detection of a master clock signal fault. Another action which may be taken by a frequency monitoring system is to provide an indication of a detected fault. Fault recovery may then be initiated by service personnel, for example.

Figure 3:
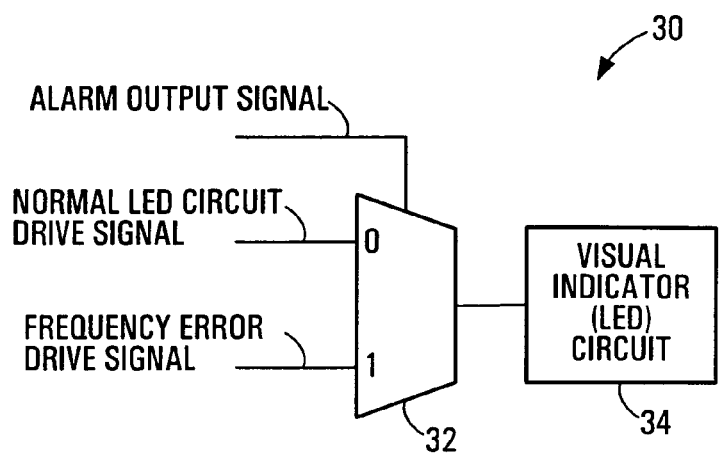
FIG. 3 is a schematic diagram of an alarm output circuit.

FIG. 3 is a schematic diagram of an alarm output circuit which provides an indication that a fault has been detected by a frequency monitoring system. The circuit 30 includes a selector 32, such as a multiplexer, and a visual indicator circuit 34, which may be an LED circuit as shown. FIG. 3, like the other drawings, provides an illustrative example of one possible structure which may be used in implementing an embodiment of the invention.

In FIG. 3, the alarm output signal normally controls the selector 32 to drive the circuit 34 with an LED circuit drive signal, which may be provided by an electronic component such as a processor or a drive circuit. When electronic equipment is operating normally, an LED in the circuit 34 may be illuminated, have a specific color, or be turned off. The state of the LED thereby provides an indication of whether the electronic equipment is operating properly. The LED is preferably located on an equipment shelf in which electronic equipment is mounted, or at a location on or within electronic equipment so as to be visible without disassembling or dismounting the equipment.

The state of the LED, however, may be dependent upon a master clock signal which is used by a processor. In the event of corruption or loss of the master clock signal, the processor may be unable to change the state of the LED, since its operations are dependent upon the master clock signal. The LED may thus be maintained in a normal state even though the processor and electronic equipment is no longer operating properly. This type of false indication tends to increase the time and effort required to find, diagnose, and correct a problem.

Where a frequency monitoring system uses a secondary signal which is generated independently of the master clock signal, then actions may be taken without requiring the master clock signal. In FIG. 3, this capability is provided by the selector 32. As shown, the alarm output signal is coupled to a control input of the selector 32. When the alarm output signal is asserted at the output of the comparator 10 of FIG. 1, for example, the selector 32 outputs the frequency error drive signal to drive the circuit 34. An LED in the circuit 34 may be turned off, driven with a specific voltage or current to change its color, or simply turned on, depending on its state under normal circumstances.

In the circuit 30, an alarm output signal is used to select a drive signal for a visual indicator circuit 34. However, in other embodiments, the alarm output signal itself may be used directly to provide an indication of a frequency error, by driving an LED for instance. Thus, an alarm output signal generated by a frequency monitoring system, or a further signal or signals derived therefrom or generated in response thereto, may be used during actions or operations which are undertaken when a frequency error has been detected.

Further actions which may be taken responsive to a signal frequency error detection will be apparent to those of skill in the art. The invention is not limited to the above or any other particular action or set of actions.

Figure 4:
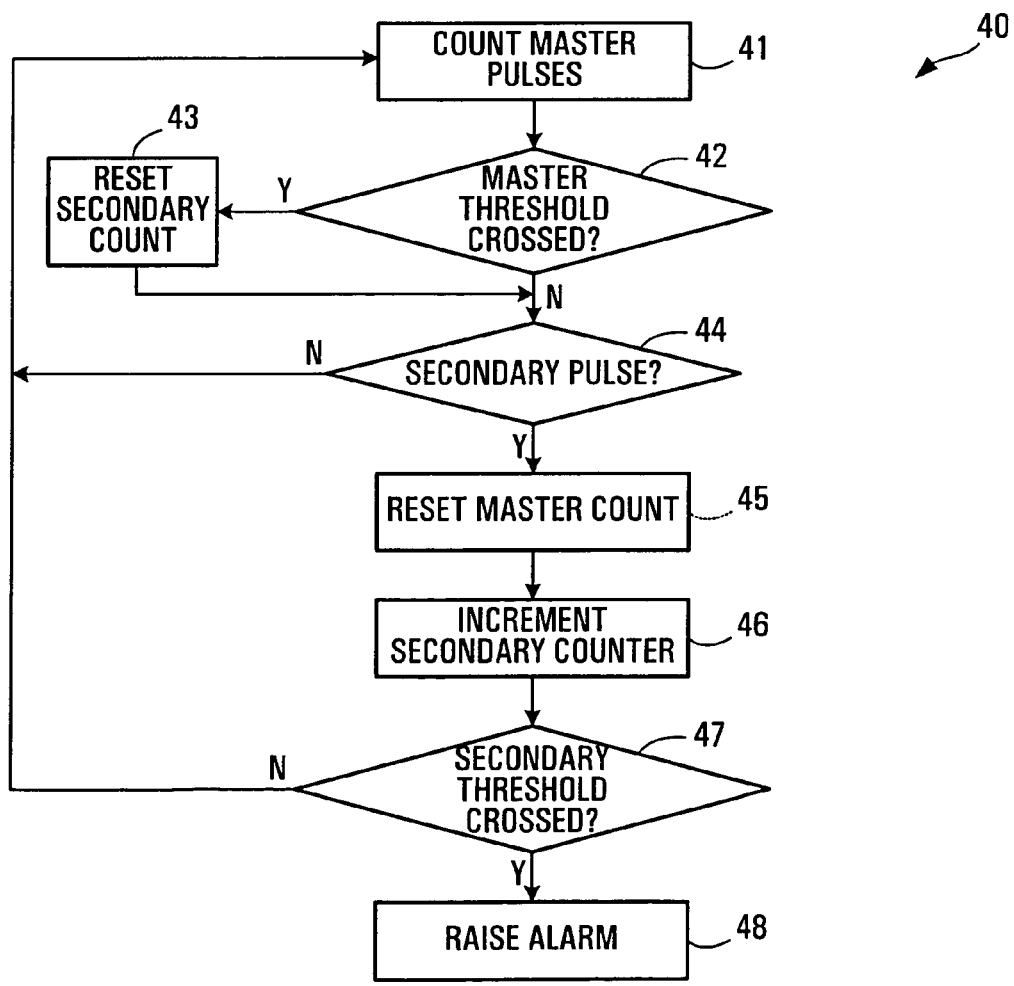
FIG. 4 is a flow diagram illustrating a frequency monitoring method according to an embodiment of the invention.

FIG. 4 is a flow diagram illustrating a frequency monitoring method according to an embodiment of the invention. The method 40 begins at 41, with counting of pulses of a master clock signal, or more generally a first periodic electrical signal to be monitored, to generate a master count.

At 42, a determination is made as to whether a master count threshold has been crossed. As described in detail above, the count of the secondary counter is reset upon the count of the master counter crossing a threshold. Thus, in FIG. 4, the secondary count is reset at 43 if the master count has crossed its threshold, which is determined at 42.

The method 40 proceeds at 44 to determine whether a secondary clock signal pulse has occurred. If not, then the method reverts back to 41, to continue counting master clock signal pulses. A secondary pulse detected at 44 may be used to reset the master count at 45 in some embodiments, and is also counted at 46 by incrementing the secondary counter.

A determination is then made at 47 as to whether a secondary count threshold, i.e., an alarm threshold, has been crossed by the count of the secondary counter. If the count of the secondary counter has crossed its threshold, a frequency error has occurred, and, as indicated at 48, an alarm may be raised. Otherwise, counting of master clock signal pulses continues at 41.

FIG. 4 represents one example of a method according to an embodiment of the invention, which may be implemented in hardware as described above, software for execution by a processor, or some combination thereof. However, variations of the method as explicitly shown in FIG. 4 are possible without departing from the scope of the present invention. For example, although shown in FIG. 4 and described above as a series of operations which are performed in a sequence, the operations of FIG. 4 need not be performed in the specific order as shown. Counting at 41 and monitoring of the counts at 42 and 47 to detect when the counts cross respective thresholds may be substantially simultaneous and continuous operations, for instance.

Further variations of the method 40 will also be apparent from the foregoing description of the system 10 (FIG. 1) and the operation thereof.

The embodiments of the invention described above provide frequency monitoring techniques which have a wide applicability to digital electronic systems which incorporate, or at least have access to, multiple clock sources. In accordance with further embodiments of the invention, multiple periodic electrical signals are monitored for frequency variations with respect to each other. Two or more clock signals may thereby be monitored to verify that their respective frequencies are within a certain tolerance with respect to each other.

One primary advantage of the further techniques disclosed herein over existing periodic electrical signal monitors is that no one signal is required to be a reference for any other signals. Accordingly, there is no requirement that a particular one of the periodic electrical signals be "healthy". It is thus possible for any of the signals to have frequency variations, including a complete loss of signal.

In one embodiment described in further detail below, this is accomplished by having each monitored periodic electrical signal clock a respective counter. The count of each counter is compared to respective sets of one or more thresholds. The thresholds are selected in a manner such that, during normal operation, they will be crossed by the counter counts in a particular sequence. If any signal drifts outside its valid or expected frequency range, including a total signal loss, then an abnormal threshold crossing sequence is detected. Actions taken responsive to the detection of this condition may include any of those described above, such as generating an alarm or initiating an activity switch. These techniques may be particularly useful, for instance, on circuit cards which have multiple clock sources.

Figure 5:
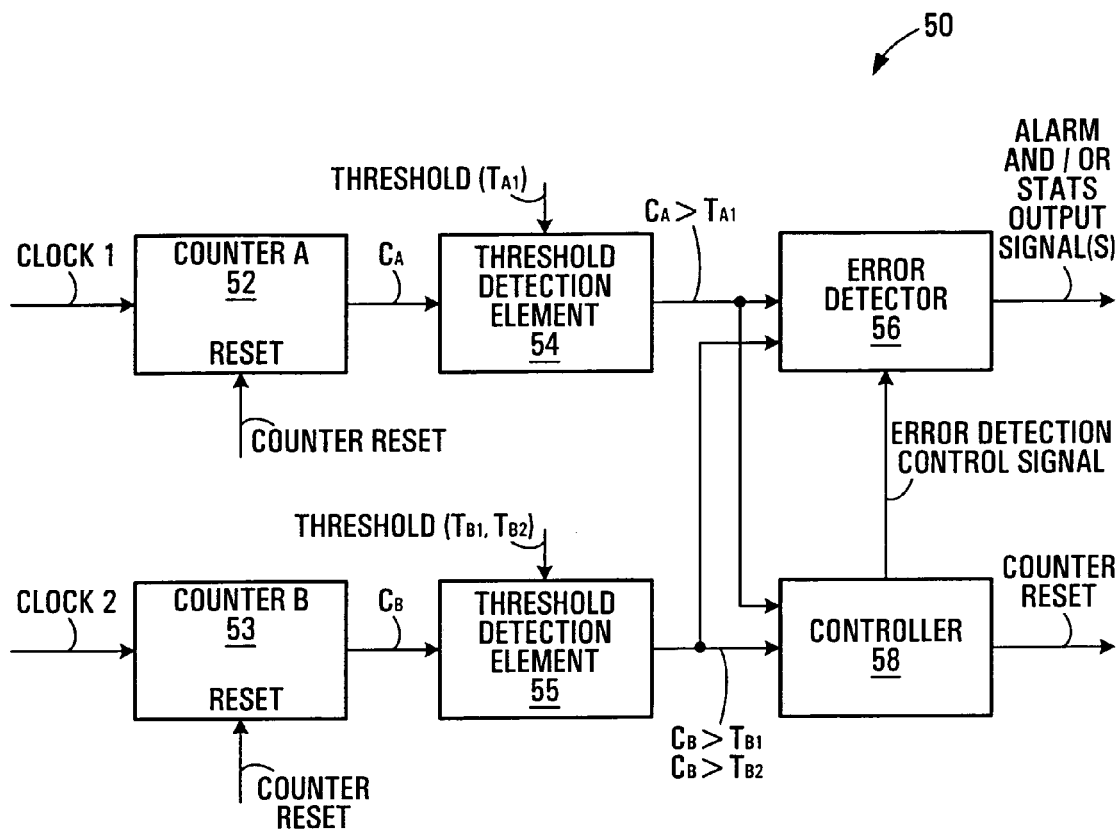
FIG. 5 is a block diagram of a frequency monitoring system in accordance with a further embodiment of the invention.

FIG. 5 is a block diagram of a frequency monitoring system in accordance with a further embodiment of the invention. The system 50 includes counters 52, 53, threshold detection elements 54, 55 connected to the counters 52, 53, and an error detector 56 and a controller 58, both of which are connected to the threshold detection elements 54, 55.

Figure 6:
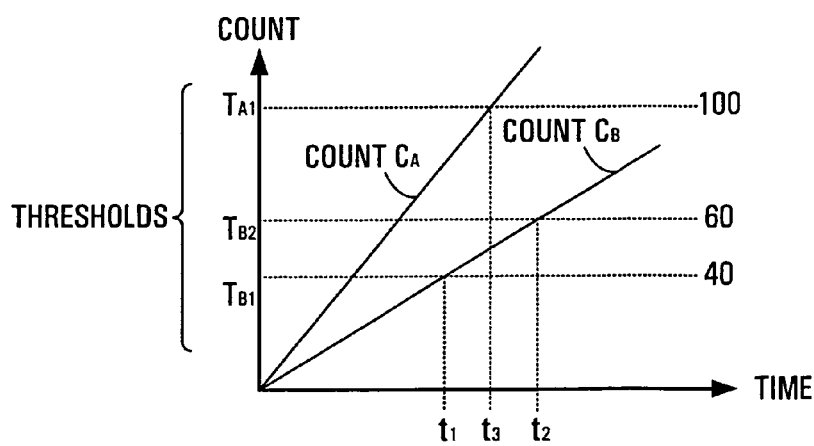
FIG. 6 is a timing diagram illustrating periodic electrical signals and the operation of the system of FIG. 5.
Figure 7:
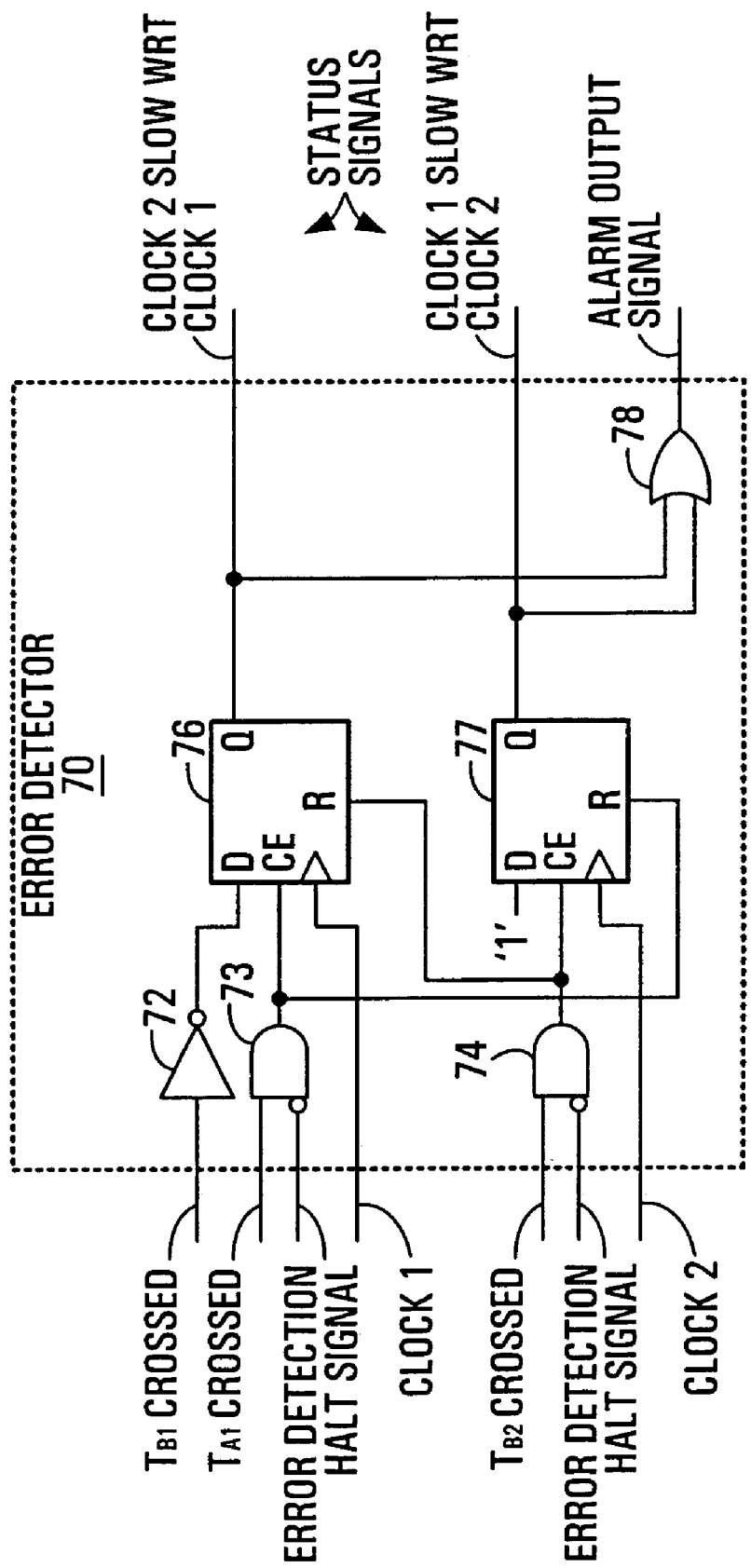
FIG. 7 is a schematic diagram of an illustrative example of an error detector.

The counters 52, 53 may be substantially the same types of components as the counters 16, 18 shown in FIG. 1. The threshold detection elements 54, 55 may be implemented using comparators or logic devices such as AND gates to combine counter output bits, for instance. Illustrative example implementations of the error detector 56 and the controller 58 are shown in FIGS. 6 and 7, respectively, and described in detail below.

As shown, the counters 52, 53 are clocked by respective periodic electrical signals, illustratively the clock signals "clock 1" and "clock 2". Respective sets of one or more thresholds are established in the threshold detection elements 54, 55. The counter 52 has a single associated threshold $T_{A1}$, whereas the counter 53 has two associated thresholds $T_{B1}$, $T_{B2}$. It should be appreciated that the particular numbers of thresholds may vary depending upon the relative frequencies of the periodic electrical signals to be monitored, and that the invention is in no way limited to the examples shown in FIG. 5 and the subsequent drawings which are described below.

In operation, the counter A 52 and the counter B 53 count pulses of their respective periodic electrical signals, clock 1 and clock 2. The threshold detection elements 54, 55 respectively detect, for counter A 52 and for counter B 53, the crossing of thresholds by the counts of the counters, and provide threshold crossing information for the counters 52, 53 to the error detector 56 and the controller 58.

The error detector 56 monitors the threshold crossing information from the threshold detection elements 54, 55. As described in further detail below, the values of the various thresholds used by the threshold detection elements 54, 55 are selected such that the thresholds are crossed by the counts of the counters 52, 53 in a particular sequence when the frequencies of the monitored periodic electrical signals are within a valid range with respect to each other. The error detector 56 determines that a frequency error has occurred if the counts of the counters 52, 53 cross their respective thresholds in other than the particular sequence.

The error detector 56 may provide a status indication and/or an error or alarm indication. The indication or indications may be provided to a higher-layer control and status entity such as system software, to a user via an LED or other device, or to other electronic components. In one embodiment described in further detail below, an alarm output signal is generated by the error detector 56 and provided to another frequency monitoring system which uses one of the periodic electrical signals as a reference signal to monitor a further periodic electrical signal. The other frequency monitoring system may then use the alarm output signal to gate its own alarm output signal.

The controller 58 also receives the threshold crossing information from the threshold detection elements 54, 55 and generates a counter reset signal to reset the counters, such as when either $T_{A1}$ or $T_{B2}$ has been crossed. It may also provide control signals to the error detector 56 for the purpose of coordinating the error detector 56 with the counters 52, 53 and the threshold detection elements 54, 55.

Thus, in the system 50, each clock signal to be monitored is used to clock a respective counter, and the count of each counter is compared to one or more thresholds associated with that counter. The counters preferably begin counting from "0" substantially simultaneously, within some tolerance. The values used for the thresholds determine the size of the valid range within which the frequencies of the periodic electrical signals may vary with respect to each other, and also an order in which the thresholds will be crossed under normal operating conditions. Threshold crossing information is received by the error detector 56 and the controller 58 and used in making determinations as to whether a frequency error has occurred or counters should be reset, for example. The combination of the threshold detection elements 54, 55, the error detector 56, and the controller 58 may thereby be considered an example implementation of a threshold detector which detects and analyzes threshold crossings to determine the health of monitored periodic electrical signals and whether any further actions should be taken or initiated.

The operation of the system 50 will now be described further detail with reference to FIG. 6, which is a timing diagram illustrating examples of counts and thresholds. In order to avoid congestion in the drawing, the monitored periodic electrical signals, clock 1 and clock 2, have not been explicitly shown in FIG. 6.

The counts and thresholds shown in FIG. 6 assume a particular example of clock 1 running at twice the speed of clock 2, with clock 1 at 20 MHz and clock 2 at 10 MHz, for example of course, the invention is not limited to monitoring periodic electrical signals with this relationship or these two particular frequencies.

Two thresholds, $T_{B1}$ and $T_{B2}$, are compared to the count $C_B$ of counter B 53 (FIG. 5) and are crossed by the count $C_B$ at times $t_1$ and $t_2$, respectively. Another threshold, $T_{A1}$, is compared to the count $C_A$ of counter A 52 and is crossed by the count $C_A$ at time $t_3$. Example values for the thresholds as shown in FIG. 6 are $T_{B1}=40$, $T_{B2}=60$, and $T_{A1}=100$.

FIG. 6 shows the relationship of the counts and thresholds. Since clock 1 is running at twice the frequency of clock 2, the count $C_A$ of counter A crosses the respective threshold $T_{A1}$ (=100) which is associated with counter A at the same time the count $C_B$ of counter B crosses a count of 50, provided that both counters were reset at the same time. Therefore, the time $t_3$, at which the count $C_A$ crosses the threshold $T_{A1}$, is midway between times $t_1$ and $t_2$ and will remain somewhere between them as long as the clock signal frequencies remain within approximately +/−20% (i.e., 10/50) of each other. This is the termed the valid range, which can be modified by changing the thresholds. For example, changing $T_{B1}$ to 45 and $T_{B2}$ to 55 would change the valid range to approximately +/−10% (i.e., 5/50). Those skilled in the art will readily appreciate that a more detailed analysis can be performed to determine the tolerances more precisely. These tolerances may also depend on implementation details, such as how precisely the counters can be "simultaneously" reset, for instance.

When the frequency relationship between the two clock signals does not fall within the valid range, the sequence in which the counts cross their respective thresholds no longer follows the valid sequence. This condition is detected by the error detector 56, which may raise an alarm signal or perform some other action. For example, clock 1 may speed up to such an extent the count $C_A$ will cross the threshold $T_{A1}$ before the count $C_B$ crosses the threshold $T_{B1}$. Likewise, the same condition may be detected if clock 2 slows down. In the event that clock 2 speeds up, then the count $C_B$ may cross the threshold $T_{B2}$ before the count $C_A$ crosses the threshold $T_{A1}$.

Once enough counter threshold crossings have been detected to determine the health of the periodic electrical signals under test, the controller 58 preferably resets the counters and the process is repeated. That is, after either the count $C_A$ crosses the threshold $T_{A1}$ or the count $C_B$ crosses the threshold $T_{B2}$, a determination may be made as to whether the thresholds have been crossed in the expected sequence. The counters may then be reset to allow for continuous monitoring of the periodic electrical signals. However, embodiments of the invention in which periodic electrical signals are monitored intermittently are also contemplated, and accordingly the reset function of the controller 58 should be regarded as optional.

The error detector 56 and the controller 58 are preferably designed to function properly without relying on the health of any one monitored periodic electrical signal, which allows monitoring circuits and methods to function properly in the face of either monitored periodic electrical signal failing. This significant advantage of some embodiments of the invention is discussed further below.

FIG. 7 is a schematic diagram of an illustrative example of an error detector. The error detector 70 shown in FIG. 7 represents one possible implementation of the error detector 56 of the monitoring system 50, although alternative implementations will be apparent to those skilled in the art.

The error detector 70 includes an inverter 72, AND gates 73, 74, flip-flops 76, 77, and an OR gate 78. The inverter 72 receives and inverts a threshold crossing detection signal for the threshold $T_{B1}$ and inputs the inverted signal to the D terminal of the flip-flop 76. The AND gate 73 receives a threshold crossing signal for the threshold $T_{A1}$ and an inverted version of an error detection halt signal, and is connected at its output to a chip enable (CE) input of the flip-flop 76 and a reset input of the flip-flop 77. The error detection halt signal is an example of a control signal which may be generated by the controller 58 (FIG. 5) to coordinate the error detector 70 with counters and threshold detection elements in a monitoring system. Generation of the error detection halt signal is described in further detail below.

The AND gate 74 is similarly connected to receive a threshold crossing detection signal, for the threshold $T_{B2}$, and the inverted version of the error detection halt signal, and to provide its output to the CE input of the flip-flop 77 and the reset input of the flip-flop 76.

Status signals are provided at the Q outputs of the flip-flops 76, 77. An alarm output signal is generated by the OR gate 78 if either of the status signals is high.

The error detector 70 effectively monitors the threshold crossing sequence as described above. Those skilled in the art will readily appreciate the operation of the error detector 70, which is therefore described only briefly herein.

In FIG. 7, all threshold crossing signals have a low level until a threshold crossing is detected. If the threshold $T_{A1}$ is crossed before the threshold $T_{B1}$, and the error detection halt signal is not asserted, then the AND gate 73 outputs a high signal to enable the flip-flop 76 and reset the flip-flop 77. Since the threshold $T_{B1}$ has not been crossed, the $T_{B1}$ threshold crossing signal is at a low level which is inverted by the inverter 72. The resultant high level signal is then latched to the Q output of the flip-flop 76, indicating that clock 2 is slow with respect to clock 1, or alternatively that clock 1 is fast with respect to clock 2.

The condition of clock 1 running slow with respect to clock 2, or clock 2 running fast with respect to clock 1, is detected by the error detector 70, and in particular the AND gate 74 and the flip-flop 77, in a substantially similar manner.

If either of the status signals, is high, indicating that a frequency error has been detected, then the OR gate 78 generates an alarm output signal.

In the error detector 70, the flip-flops 76, 77 are respectively clocked by different periodic electrical signals. Accordingly, at least one status signal and thus an alarm output signal may be generated if either one of clock 1 and clock 2 is lost. It should also be noted that the reset input of each flip-flop 76, 77 is asynchronous to its clock. Thus, the error detector 70 is able to provide a frequency error indication whether clock 1 or clock 2 is lost. In contrast, conventional frequency monitors tend to be inoperable in the event of loss of a reference signal.

Alternative implementations of an error detector may be used without departing from the invention. For example, the memory elements or latches shown in FIG. 7 are synchronous flip-flops, whereas an asynchronous latch design is also possible.

Figure 8:
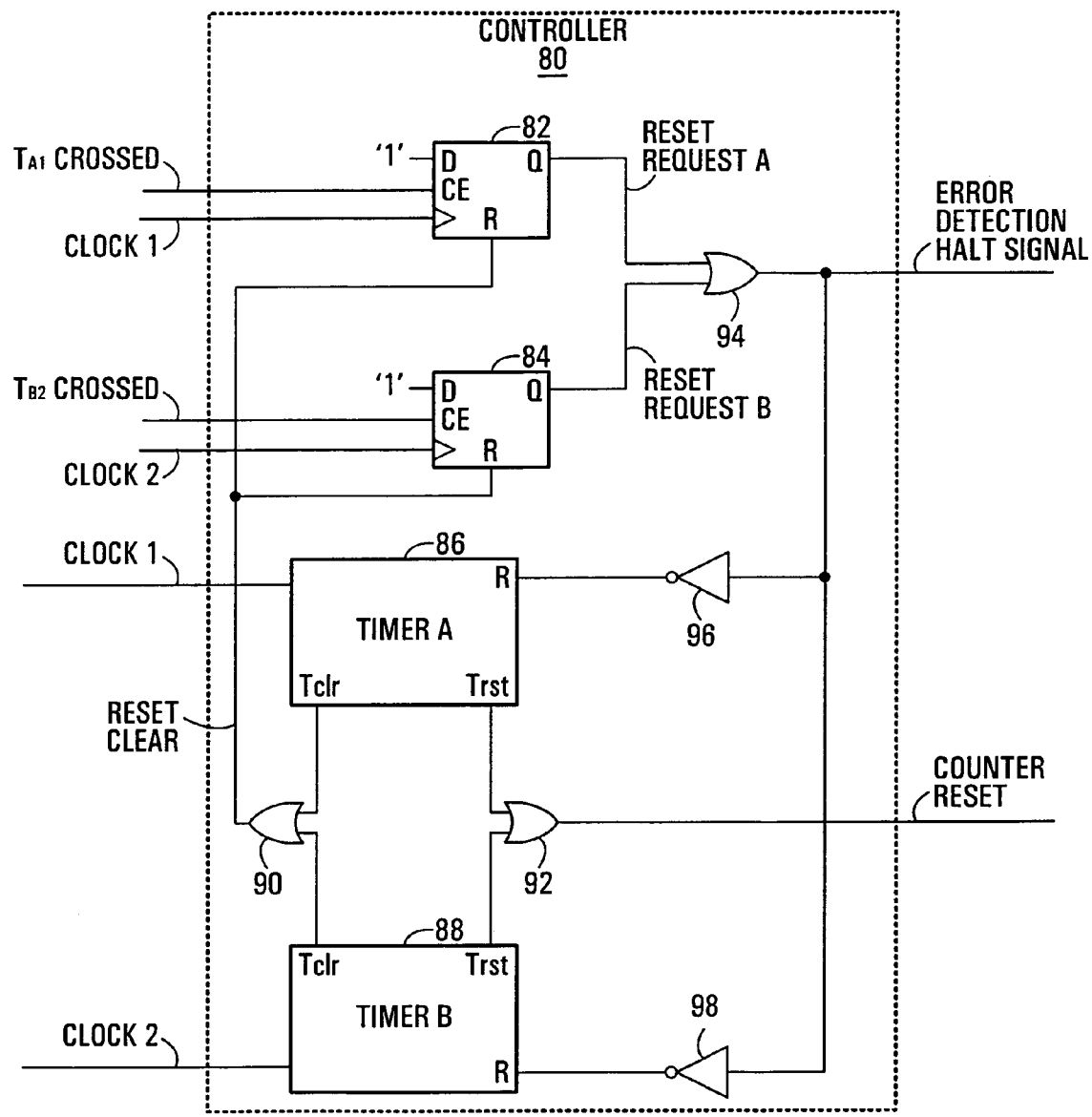
FIG. 8 is a schematic diagram of an illustrative example of a controller.

FIG. 8 is a schematic diagram of a controller which may be used as the controller 58 in FIG. 5. As noted above in conjunction with the error detector 70 of FIG. 7, the controller 80 of FIG. 8 is intended for illustrative purposes, and many alternative controller designs may be apparent to those skilled in the art.

The controller 80 includes flip-flops 82, 84, timers 86, 88, OR gates 90, 92, 94, and inverters 96, 98. The flip-flops 82, 84 have their D inputs connected to a logic high, their CE inputs connected to threshold crossing signals for the thresholds $T_{A1}$ and $T_{B2}$, respectively, their reset inputs connected to an output of the OR gate 90, and their Q outputs connected to the inputs of the OR gate 94. The OR gate 94 asserts the error detection halt signal at its output if the output of either of the flip-flops 82, 84 is high, indicating that the counters should be reset.

The error detection halt signal is also provided to the inverters 96, 98, which reset the timers 86, 88. $T_{clr}$ and $T_{rst}$ outputs of the timers 86, 88 are provided to the OR gates 90, 92, the outputs of which respectively provide a reset clear signal and a counter reset signal. The reset clear signal is provided to the flip-flops 82, 84, whereas the counter reset signal is provided to the counters 52, 53 (FIG. 5).

The various components shown in FIG. 8 and their operation in the controller 80 will be readily apparent from the foregoing description and well-understood operating principles of these components. Only a relatively brief description of the operation of the controller 80 is thus provided below.

In the controller 80, the timers A 86 and B 88 are clocked by clock 1 and clock 2, respectively, and are both held in (asynchronous) reset when the error detection halt signal is de-asserted. When the counter A crosses the threshold $T_{A1}$ or the counter B crosses the threshold $T_{B2}$, a reset request signal (reset request A or reset request B, respectively) is latched in one of the flip-flops 82, 84.

The latching of a reset request signal begins a reset operation. The first phase of the reset operation is to halt the error detector by asserting the error detection halt signal. This assertion also enables the two timers, timer A 86 and timer B 88. Within each of the timers 86, 88, a counter begins counting from "0" when the error detection halt is asserted. When the counter in a timer crosses a first threshold, $T_{rst}$ is asserted, and when it crosses a second threshold, $T_{clr}$ is asserted. Whenever the $T_{rst}$ output is first asserted by one of the timers 86, 88, the counter reset output from the controller 80 is asserted. Whenever the $T_{clr}$ output is first asserted by one of the timers 86, 88, the internal reset clear signal is asserted. The assertion of the reset clear signal asynchronously resets the flip-flops 82, 84 and thus the reset request signals, which in turn de-asserts the error detection halt signal. The inverters 96, 98 invert the error detection halt signal, causing the timers 86, 88 to be asynchronously reset, that is, their internal counters are cleared to "0" and the $T_{clr}$ and $T_{rst}$ outputs are de-asserted.

It is worthy to note that the controller 80 is immune to an underfrequency of either clock signal, while an overfrequency will result in shorter pulse widths of the error detection halt and counter reset signals. Thus, the internal thresholds of each timer are preferably chosen to ensure proper operation under an expected worst-case overfrequency condition.

Figure 9:
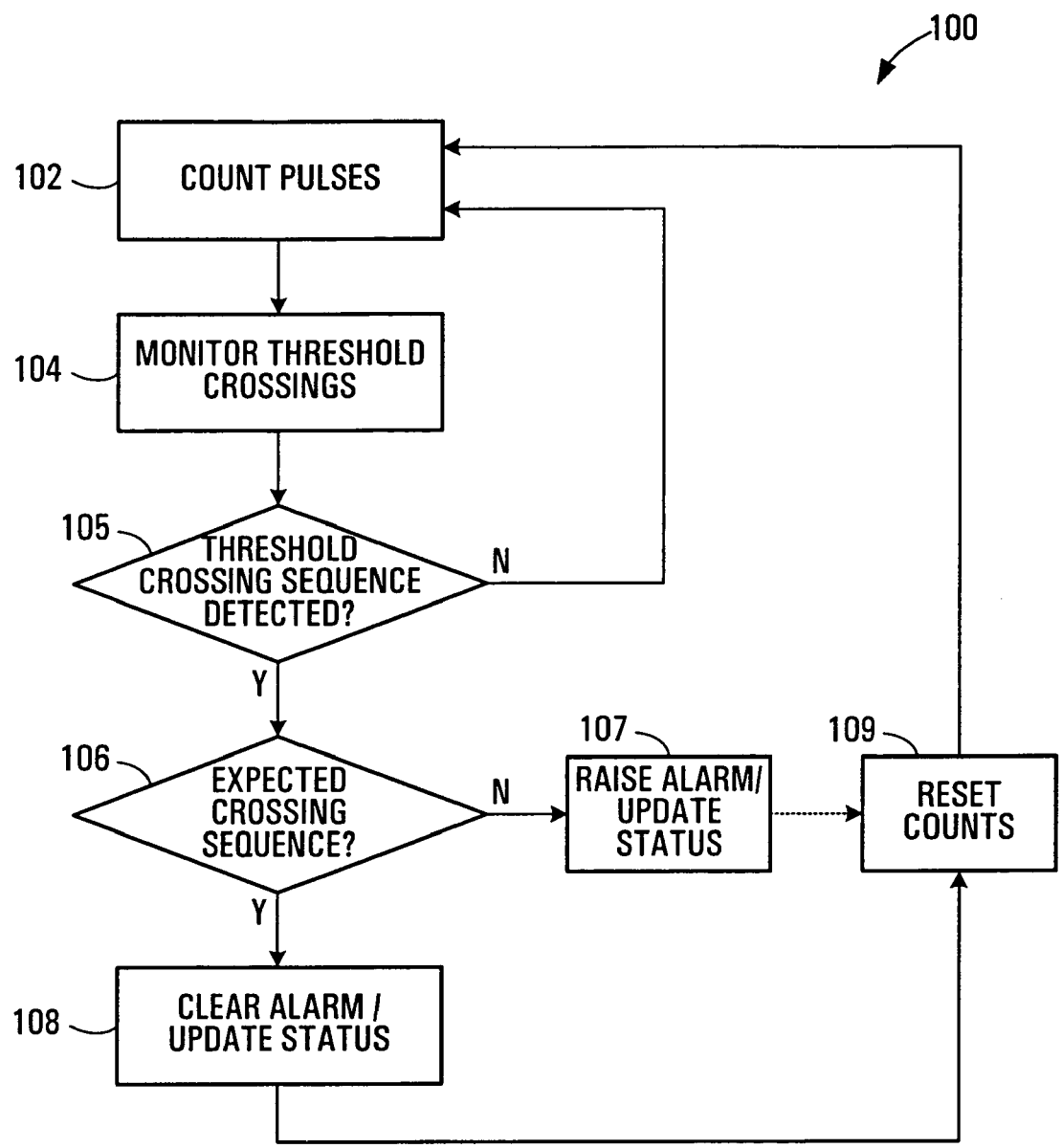
FIG. 9 is a flow diagram illustrating a frequency monitoring method according to another embodiment of the invention.

FIG. 9 is a flow diagram illustrating a frequency monitoring method according to another embodiment of the invention. Many of the operations shown in FIG. 9 have been described in detail above in the context of a monitoring system, and accordingly will be described only briefly below.

The method 100 begins at 102 with counting pulses of periodic electrical signals, to generate respective counts. Each of the counts has one or more respective associated thresholds. At 104, crossings of the thresholds by corresponding counts are monitored. A determination is made at 105 as to whether a threshold crossing sequence has been detected. Referring momentarily to FIG. 6, the determination at 105 may be positive if the crossing of $T_{A1}$ or $T_{B2}$ is detected.

If further threshold crossings must be detected before a threshold crossing sequence can be identified, then counting and monitoring continue at 102 and 104. This would be the case, for example, when only $T_{B1}$ (FIG. 6) has been detected. When a threshold crossing sequence has been detected, the method 100 proceeds at 106 with an operation of determining whether the detected threshold crossing sequence matches a particular expected threshold crossing sequence. If the counts do not cross their thresholds in a particular sequence corresponding to the expected threshold crossing sequence, then a frequency error has occurred. An alarm output signal may be generated and other actions such as updating a clock or system status may be taken or initiated in the event of a frequency error, as indicated at 107. The counts may also be reset at 109 to enable continuous monitoring of the periodic electrical signals.

In some embodiments, no action is taken when the thresholds are crossed in the expected order. Alternatively, any current clock alarms may be cleared and/or one or more status indications may be provided or updated at 108, and counts may also be reset at 109.

The sequence determination at 106 is accomplished through electronic circuitry in the error detector 70 of FIG. 7, for example. Other embodiments may first determine an actual sequence in which the counts cross their respective thresholds and then determine whether the actual sequence matches the particular sequence, as shown in FIG. 9. A software module, for instance, may access a memory to retrieve stored information relating to the expected sequence and compare the actual sequence with the expected sequence. Thus, it should be clear that the monitoring techniques disclosed herein may be implemented using other than the specific hardware shown in the drawings and their inherent functions.

Frequency monitoring of two periodic electrical signals without requiring either of the signals to be a reference signal has been described above. Embodiments of the invention may also be implemented to monitor more than two signals. Three or more signals may simply be monitored in a pair-wise manner substantially as described above and an overall alarm signal can be generated by a logical OR of the alarm signals from each pair-wise monitor. The expansion of the system 50 to include further counters and threshold detectors, and modification of the error detector 56, 70 and the controller 58, 80 to support pair-wise monitoring and error detection will be readily apparent to those skilled in the art based on the two-signal monitoring techniques disclosed herein.

With three or more pair-wise monitored periodic electrical signals, it is possible to determine which particular periodic electrical signal has failed, at least in the event of a single failure, via a "voting" algorithm. For instance, if two of three status output signals indicate that one clock signal is running slow, then it may be determined that the one clock signal has failed. Similarly, three of four status signals may indicate that a particular one of four monitored periodic electrical signals has failed. Both single and multiple failures may be detected in a similar manner when monitoring a higher number of periodic electrical signals.

Alternatively, it is possible and practical to instantiate multiple counters and threshold detection elements and expand the error detector and controller to support a more integrated approach to monitoring more than two periodic electrical signals. In the error detector 70, for example, further logic devices may be provided to combine threshold crossing signals to generate data, enable, and reset inputs to various latches which provide alarm and/or status output signals. Similar modifications may be made to the controller 80 to implement monitoring systems for more than two signals.

Figure 10:
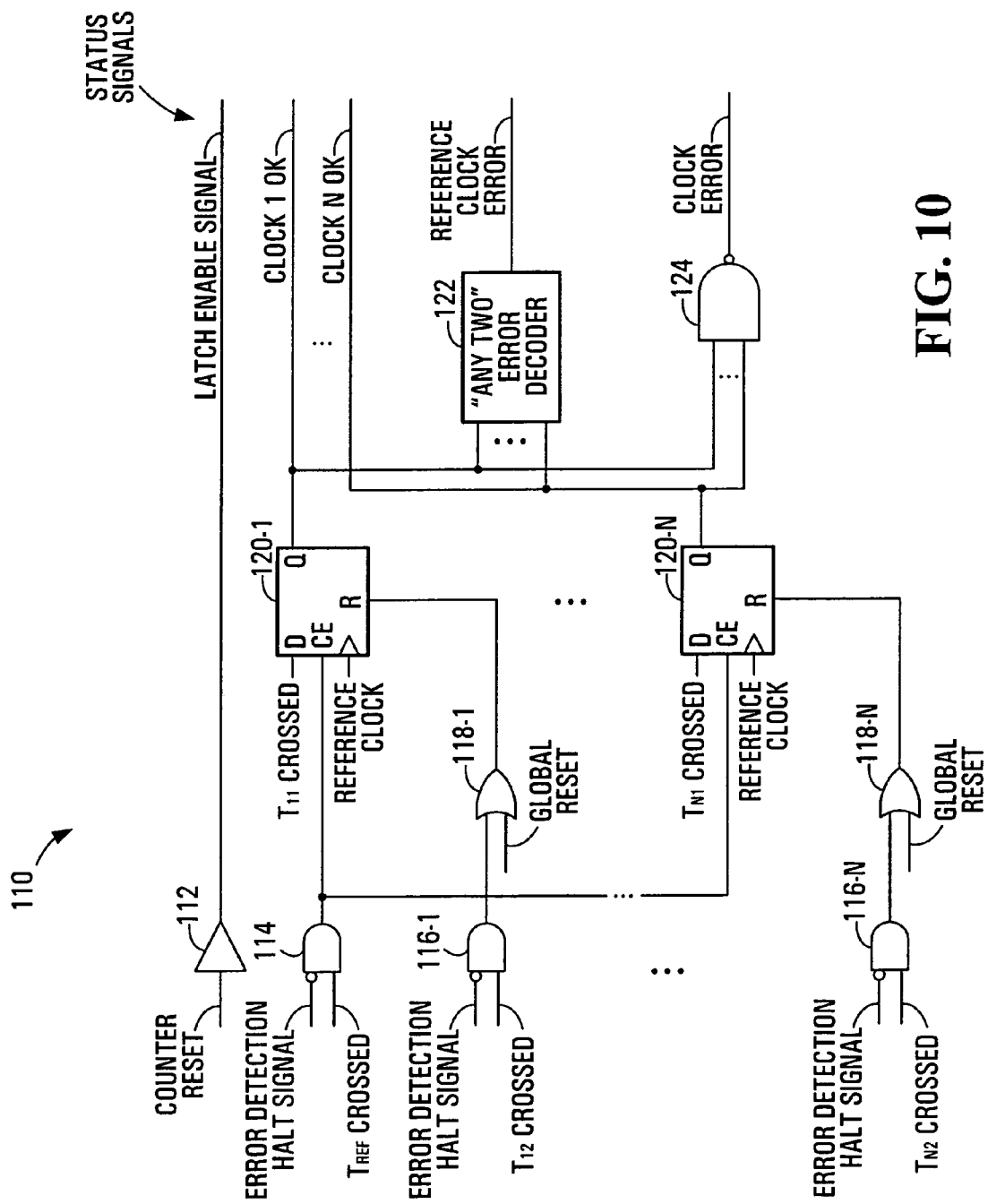
FIG. 10 is a schematic diagram of an example error detector for a monitoring system in which more than two periodic electrical signals are monitored.
Figure 11:
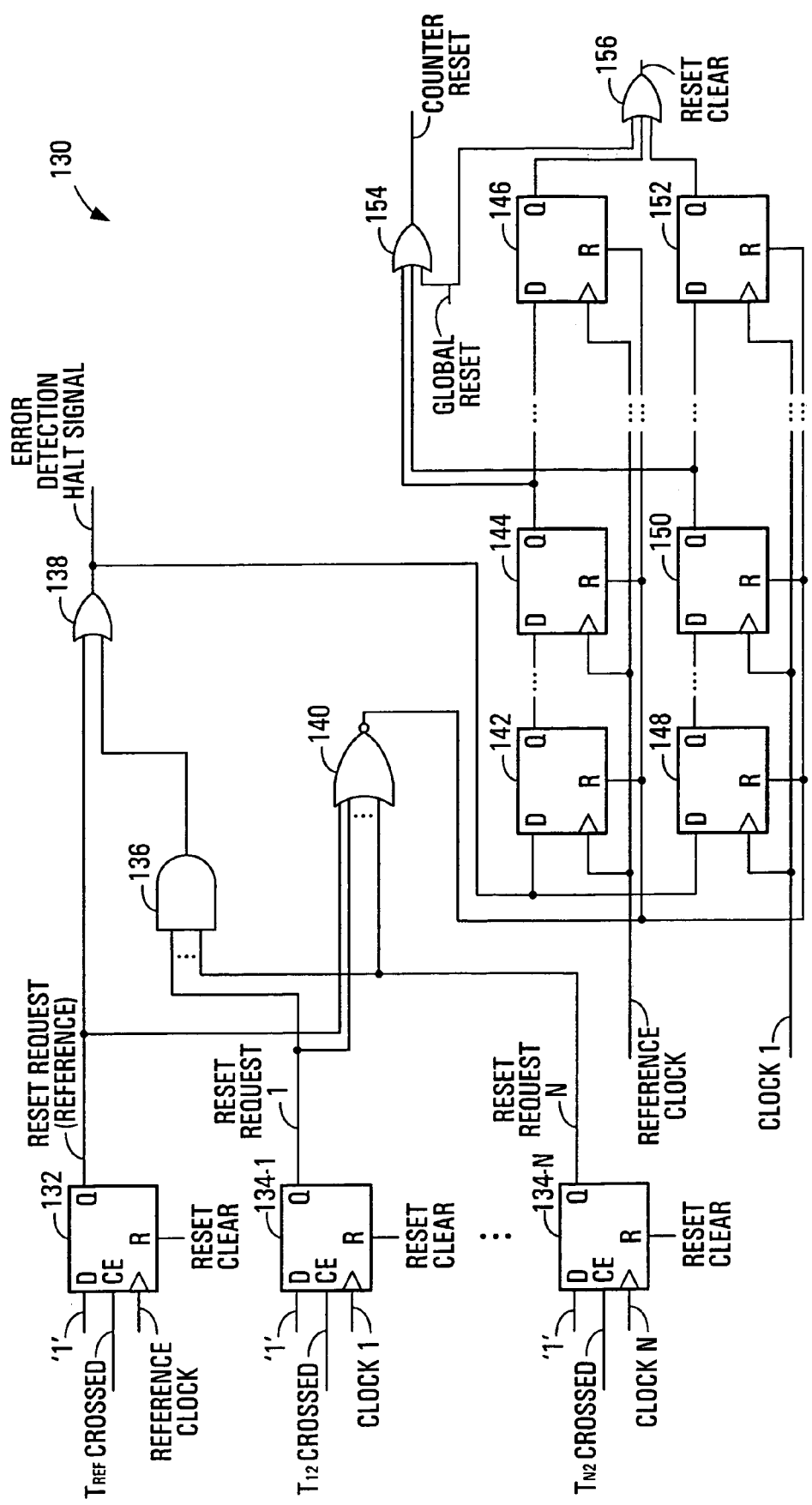
FIG. 11 is a schematic diagram of an example controller for a monitoring system in which more than two periodic electrical signals are monitored.

FIGS. 10 and 11 illustrate examples of a modified error detector and a modified controller, respectively, in which monitoring of more than two electrical signals is provided in a somewhat different manner. Other possible modifications to the systems and techniques disclosed herein to provide for monitoring of more than two periodic electrical signals are well within the capabilities of a skilled person, and are also considered to be within the scope of the present invention.

Referring now to FIG. 10, the error detector 110 includes a buffer 112, AND gates 114 and 116-1 through 116-N, OR gates 118-1 through 118-N, flip-flops 120-1 through 120-N, an error decoder 122, and a NAND gate 124.

The error detector 110 monitors N+1 periodic electrical signals. Although N signals are monitored with respect to one common reference signal, it should be appreciated that the reference signal is also effectively monitored with respect to the other signals. As shown, various status signals are provided by the error detector 110 to indicate correct and incorrect threshold crossings. Notably, one of the status signals provides an indication of a reference clock error. Therefore, the error detector 110 detects frequency errors in the reference signal itself, unlike conventional frequency monitors.

In the error detector 110, the expected threshold crossing sequence for each of N monitored signals, two of which have been labelled as clock 1 and clock N in FIG. 10, with respect to the reference clock is similar to that shown in FIG. 6. A counter clocked by the reference clock signal has a single threshold, and each counter clocked by a monitored clock signal has two thresholds. Thus, $T_{REF}$ in FIG. 10 is analogous to $T_{A1}$ in FIG. 6, and $T_{x1}$, $T_{x2}$ (x=1, ..., N) are analogous to $T_{B1}$, $T_{B2}$ in FIG. 6. Each of the N clock signals in FIG. 10 is deemed to be within an acceptable frequency tolerance of the reference clock signal for a given test cycle if its first threshold $T_{x1}$ has been crossed when the reference counter count crosses $T_{REF}$ (i.e., it is not slow), and if its second threshold $T_{x2}$ is not crossed before the reference counter count crosses $T_{REF}$ (i.e., it is not fast).

The error detector 110 does not differentiate between fast and slow errors. However, fast and slow clock errors could be differentiated, by incorporating two flip-flops per non-reference clock signal into an error detector, for example. One of the flip-flops would indicate that the clock signal is fast compared to the reference clock signal, and the other would indicate that it is slow. The error detector 110, with one flip-flop 120-x per non-reference clock signal, requires fewer device resources, including not only flip-flops but also decoding logic. The distinction between fast and slow errors is moderately or even questionably useful, so the error detector 110 may be suitable for most implementations.

Even though the error detector 110 monitors clock signals using one clock signal as a reference, clock signal failure resiliency is maintained in that an asynchronous path is used to update the flip-flops 120-1 through 120-N if a non-reference clock is fast compared with the reference clock signal. This ensures proper operation in the event of a reference clock signal loss. In accordance with general logic circuit operating principles, the asynchronous reset path is assumed to take precedence over synchronous flip-flop updates.

The outputs of the flip-flops 120-1 through 120-N provide an indication of whether each non-reference clock signal is within an acceptable tolerance of the reference clock signal, and may be provided as status signal outputs of the error detector 110. The error detector 110 may also decode the outputs of the flip-flops 120-1 through 120-N as shown, to provide "reference clock error" and "clock error" status signals. The "any two" error decoder 122, various possible implementations of which will be apparent to those skilled in the art, asserts a signal at its output when two or more non-reference clock signals are declared to be in error. Although multiple clock signal errors are possible, this event is more likely a result of a reference clock signal error.

The NAND gate 124 outputs a logic high signal in the event that a frequency error has been detected in any of the non-reference clock signals, indicating that at least one clock signal is in error.

Because the various status signals are combinationally derived from asynchronous and potentially meta-stable error indications, the status signals may be glitched and/or meta-stable. In some cases, the glitches/meta-stability are tolerable by downstream logic. For example, if a status signal is only used to drive an LED, then brief glitches and/or meta-stability on the signal would not be noticeable.

Otherwise, any of several options may be implemented in the downstream logic to handle the glitches/meta-stability in the status signals. The glitches/meta-stability will be very transient and, as such, can be easily filtered out by downstream debouncing. The status signals might also be sampled, qualified by the latch enable signal. The latch enable signal may be retimed into a "trusted" clock domain, for example, and then used to gate the sampling of the other status signals. The latch enable signal could instead be used to qualify the asynchronous latching of the other status signals or to clock another flip-flop which registers the status signals.

In the error detector 110, the latch enable signal is asserted when counters are being reset. During a counter reset phase, the status signals are guaranteed to be stable. This can be shown to be true by noting that the error decoding logic will be stable when the error detection halt signal is active, or when the lower threshold crossing indications for all counters are active.

FIG. 10 also introduces a global reset input to asynchronously reset all flip-flops 120-1 through 120-N. Since the error detector 110 is reset periodically by the error detection halt signal, it is not strictly necessary to assert the global reset input on startup, assuming that the outputs of the error detector 110 are ignored until the first valid test cycle is completed.

FIG. 11 illustrates an example controller 130 which may be used in conjunction with the error detector 110. The controller 130 includes flip-flops 132, 134-1 through 134-N, 142, 144, 146, 148, 150, 152, an AND gate 136, OR gates 138, 154, 156, and a NOR gate 140.

The controller 130, like the controller 80 described above, coordinates the operation of clock signal counters and the error detector 110. Although the controller 130 is adapted for a clock signal monitor which monitors more than two clock signals, its operation will be readily understood by those skilled in the art in light of the above description of the controller 80 and thus is described only briefly below.

A threshold crossing signal for each counter is synchronously latched on input to the flip-flops 132 and 134-1 through 134-N into a reset request signal. The resulting reset request signals are combinationally decoded by the AND gate 136 and the OR gate 138 to generate the error detection halt signal. The error detection halt signal is asserted when either the counter clocked by the reference counter has crossed its threshold or all of the counters clocked by non-reference clock signals have crossed their respective upper thresholds $T_{x2}$.

The error detection halt signal also triggers a redundant pair of timers. In the controller 130, the timers are implemented by multi-tap delay lines, which represent one possible implementation of the timers 86, 88 in the controller 80. As described above, the first timer to reach its first tap will cause the counter reset signal to be asserted, and the first timer to reach its final tap will cause reset requests to be asynchronously cleared via the reset clear signal.

The redundant timers are used to avoid any dependence on the presence of a single clock signal. In the controller 130, the reference clock signal and one non-reference clock signal, clock 1, respectively clock the redundant timers. In other embodiments, different clock signals may be used to clock the timers. It is also possible to include further redundant timers to increase the level of clock failure resiliency of the controller 130 and thus a clock signal monitor incorporating the controller 130.

Assertion of the global reset input will also cause the counter reset and reset clear signals to be asserted. With reference to FIG. 10, the latch enable signal will also be asserted and all clock signals will then be declared as being in error.

As noted above, FIGS. 10 and 11 represent examples of an error detector and a controller for a monitoring system in which periodic electrical signals are monitored with respect to a common periodic electrical signal. This ensures that the complexity of the circuit scales linearly with the number of signals to be monitored. For example, although it would be possible to compare every clock signal with every other clock, the complexity would be significantly increased.

Several techniques for monitoring frequencies of periodic electrical signals have been described above. In some embodiments, a reference signal is used to monitor another signal, such as a processor master clock, whereas according to other embodiments, signals are monitored relative to each other without requiring any one signal to serve as a reference signal.

The above embodiments need not necessarily be mutually exclusive, and may be implemented in the same electronic equipment. For example, the monitor of FIG. 5 could be employed to monitor the secondary clock signal used in the monitor of FIG. 1. Such a combination may be used to detect the condition of the secondary clock signal running too fast, in which case the alarm output signal at the output of the comparator 19 could be de-activated by gating the alarm output signal through an AND gate or other device for instance. If the secondary clock signal runs too fast, then the master clock counter could be reset before it crosses its threshold. This would then result in the secondary counter not being reset and ultimately crossing the alarm threshold, thereby raising a false alarm. However, judicious selection of the thresholds and relationship between the master and secondary clock signal frequencies would mitigate the risk of raising a false alarm due to an over-frequency error of the secondary clock.

In one sense, the master clock signal monitoring techniques may be considered a special case of threshold sequence-based monitoring in that embodiments of the former techniques may monitor for an error sequence of the secondary counter count crossing the alarm threshold before the master counter counts crosses the reset threshold. The "particular" sequence expected under normal circumstances in this case would be the master counter count crossing the reset threshold before the secondary counter count crosses the alarm threshold.

Figure 12:
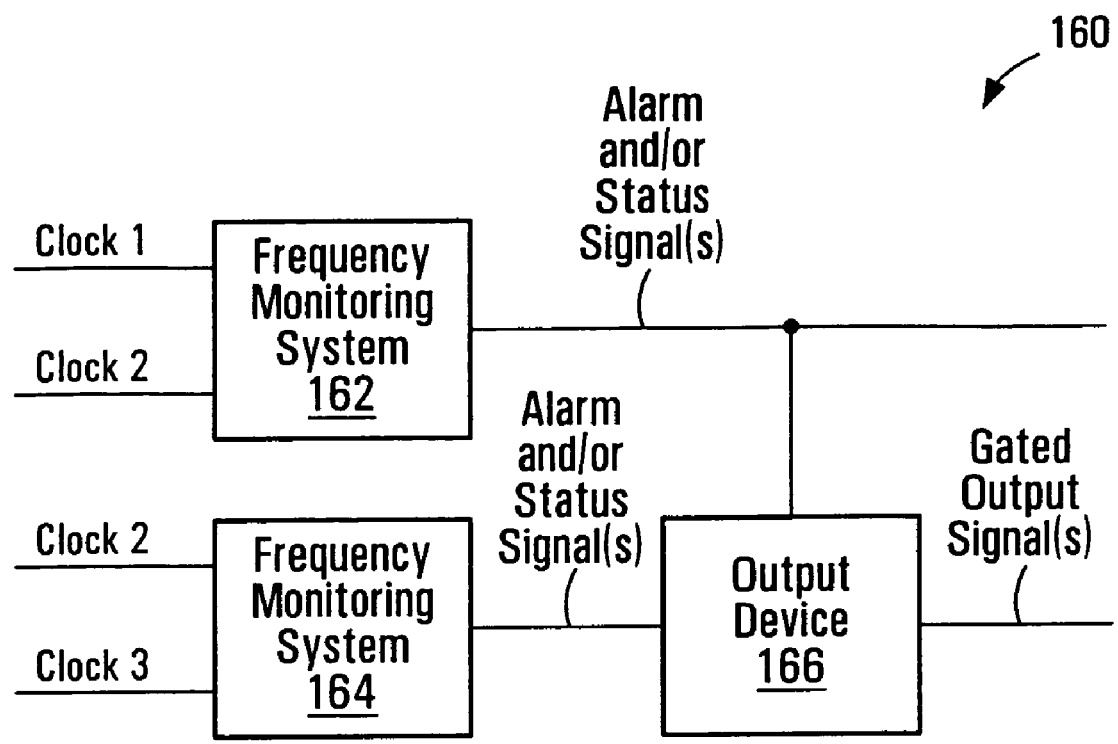
FIG. 12 is a block diagram of an output signal gating arrangement according to another embodiment of the invention.

FIG. 12 is a block diagram of such an output signal gating arrangement according to another embodiment of the invention. The arrangement 160 includes two frequency monitoring systems 162, 164 and an output device 166 operatively coupled to the frequency monitoring systems. Each frequency monitoring system 162, 164 may operate substantially as described above to monitor a respective pair of periodic electrical signals, shown in FIG. 12 as clock signals, with respect to each other and to generate alarm and/or status signals based on the monitoring. The output device 166 provides the output signal gating functionality described above. As shown, the frequency monitoring system 162 monitors clock 1 and clock 2, and the frequency monitoring system 164 monitors clock 2 and clock 3. Where the frequency monitoring system 162 determines that the frequency of clock 2 differs from a target frequency, clock 1 in FIG. 12, a resultant alarm output signal is provided to the output device 166. The output device 166, which may be an AND gate as noted above, gates alarm and/or status signals that are generated by the frequency monitoring system 164 based on clock 2 and clock 3. This prevents the output of alarm and/or status signals generated by the frequency monitoring system 164 when a frequency error in clock 2 is detected by the frequency monitoring system 162. Output signals from one frequency monitoring system 164 can thereby be disabled if an alarm output signal is generated by another frequency monitoring system 162. It will thus be apparent from FIG. 12 that a frequency monitoring system such as 162 may provide its output signals to another frequency monitoring system, and that a frequency monitoring system such as 164 may receive output signals from another frequency monitoring system. In some embodiments, a frequency monitoring system may both provide its output signals to and receive output signals from another frequency monitoring system.

What has been described is merely illustrative of the application of principles of the invention. Other arrangements and methods can be implemented by those skilled in the art without departing from the scope of the present invention.

For example, only the components involved in frequency monitoring have been explicitly shown in the drawings. Electronic equipment in conjunction with which the techniques disclosed herein may be implemented may include many other components which have not been shown or described. The present invention does not presume the presence, or absence, of any particular additional components, and may be implemented in various types of electronic equipment.

In addition, although described primarily in the context of methods and systems, other implementations of the invention are also contemplated, as instructions stored on a machine-readable medium for example.

We claim:

1. A system for monitoring frequencies of periodic electrical signals, comprising:

a plurality of counters clocked by respective periodic electrical signals, each of the plurality of counters having a respective associated threshold; and a threshold detector configured to detect, for each of the plurality of counters, crossing of each threshold associated with the counter by the count of the counter, and to determine whether a frequency error has occurred based on whether the counts of the plurality of counters cross their respective thresholds in other than a particular sequence with respect to each other, wherein the threshold detector comprises:

a plurality of threshold detection elements for detecting the crossing of each threshold associated with a respective counter by the count of the counter; and an error detector coupled to receive threshold crossing information from the plurality of threshold detection elements and configured to determine, based on the threshold crossing information, whether the counts of the plurality of counters cross their respective thresholds in other than the particular sequence.

2. The system of claim 1, wherein the error detector comprises:
a plurality of latches respectively clocked by the plurality of periodic electrical signals and configured to generate respective output signals responsive to threshold crossing sequences other than the particular sequence.

3. The system of claim 1, wherein the threshold detector further comprises:
a controller coupled to receive at least a portion of the threshold crossing information from the plurality of threshold detection elements and configured to generate the error detection control signal based on the portion of the threshold crossing information.

4. The system of claim 1, wherein the threshold detector further comprises:
a controller coupled to receive at least a portion of the threshold crossing information from the plurality of threshold detection elements and configured to coordinate the counters and the error detector by generating an error detection control signal for disabling the error detector and a counter reset signal for resetting the plurality of counters.

5. The system of claim 1, wherein the periodic electrical signals comprise more than two periodic electrical signals, and wherein the error detector is configured to determine whether a frequency error has occurred based on whether the counts in each of a plurality of pairs of counts cross respective thresholds in other than a respective particular sequence with respect to each other.

6. The system of claim 5, wherein the error detector is configured to determine whether a frequency error has occurred based on a logical OR of signals indicating whether the counts in the plurality of pairs of counts cross respective thresholds in other than a respective particular sequence with respect to each other.

7. The system of claim 5, wherein the error detector is further configured to identify a failed periodic electrical signal based on which pairs of counts of the plurality of pairs of counts cross the respective thresholds in other than the respective particular sequence with respect to each other.

8. A system for monitoring frequencies of periodic electrical signals, comprising:
a plurality of counters clocked by respective periodic electrical signals, each of the plurality of counters having a respective associated threshold; and
a threshold detector configured to detect, for each of the plurality of counters, crossing of each threshold associated with the counter by the count of the counter, and to determine whether a frequency error has occurred based on whether the counts of the plurality of counters cross their respective thresholds in other than a particular sequence with respect to each other,
wherein the threshold detector is further configured to generate an alarm output signal where the counts of the plurality of counters cross their respective thresholds in other than the particular sequence,
wherein one of the periodic electrical signals is provided to a further monitoring system, the further monitoring system being configured to detect a frequency error in a further periodic electrical signal using the one of the periodic electrical signals as a reference signal, to generate a further alarm output signal responsive to detecting the frequency error, and to disable the further alarm output signal where the alarm output signal is also generated by the monitoring system.

9. A system for monitoring frequencies of periodic electrical signals, comprising:
a plurality of counters clocked by respective periodic electrical signals, each of the plurality of counters having a respective associated threshold;
a threshold detector configured to detect, for each of the plurality of counters, crossing of each threshold associated with the counter by the count of the counter, and to determine whether a frequency error has occurred based on whether the counts of the plurality of counters cross their respective thresholds in other than a particular sequence with respect to each other, wherein the threshold detector is further configured to generate an alarm output signal where the counts of the plurality of counters cross their respective thresholds in other than the particular sequence;
a first further counter clocked by a further periodic electrical signal to be monitored;
a second further counter clocked by one of the periodic electrical signals;
a further threshold detector configured to reset one of the first further counter and the second further counter when a count of the other of the first further counter and the second further counter crosses a reset threshold, and to generate a further alarm output signal when a count of the one of the first further counter and the second further counter crosses an alarm threshold; and
an output device for receiving the further alarm output signal and the alarm output signal and for gating the further alarm output signal based on the alarm output signal.

10. A method of monitoring frequencies of periodic electrical signals, comprising:
counting pulses of a plurality of periodic electrical signals to generate a respective plurality of counts, the plurality of counts having respective associated thresholds;
detecting a crossing, by each of the plurality of counts, of each threshold associated with the count; and
determining whether a frequency error has occurred based on whether the counts cross their respective thresholds in other than a particular sequence with respect to each other,
wherein the plurality of periodic electrical signals comprises more than two periodic electrical signals, and wherein determining comprises determining whether a frequency error has occurred based on whether the counts of each of a plurality of pairs of counts cross respective thresholds in other than a particular sequence with respect to each other.

11. The method of claim 10, further comprising:
generating pair-wise alarm signals indicating whether the counts of each of the plurality of pairs of counts cross the respective thresholds in other than the particular sequence with respect to each other; and
generating an overall alarm signal based on a logical OR of the pair-wise alarm signals.

12. The method of claim 10, further comprising:
generating pair-wise alarm signals indicating whether the counts of each of the plurality of pairs of counts cross the respective thresholds in other than the particular sequence with respect to each other; and
identifying a failed periodic electrical signal based on the pair-wise alarm signals.

13. A system for monitoring periodic electrical signals with respect to each other, the system comprising:
- a first counter for counting pulses in a first periodic electrical signal having a first rate, from a reset value to a threshold $T_{A1}$;
- a second counter for counting pulses in a second periodic electrical signal having a second rate lower than the first rate, from the reset value to a first threshold $T_{B1}$ and a second higher threshold $T_{B2}$;
- an error detector operatively coupled to the first and second counters for detecting an invalid sequence of threshold crossings by counts of the first and second counters; and
- a controller operatively coupled to the first and second counters for resetting the first and second counters to the reset value after the count of the second counter crosses the threshold $T_{B2}$.

14. The system of claim 13, wherein the thresholds $T_{A1}$, $T_{B1}$, and $T_{B2}$ are selected based on the first and second rates to define a valid sequence of threshold crossings comprising the count of the first counter crossing the threshold $T_{A1}$ at a time $t_3$ which is after a time $t_1$ when the count of the second counter crosses the threshold $T_{B1}$ and before a time $t_2$ when the count of the second counter crosses the threshold $T_{B2}$.

15. The system of claim 13, further comprising:
- at least one further counter, operatively coupled to the error detector, each of the at least one further counter counting pulses in a respective signal of at least one further periodic electrical signal, wherein the error detector comprises a plurality of pair-wise monitors, each pair-wise monitor of the plurality of pair-wise monitors being operable to detect an invalid sequence of threshold crossings by counts of respective pairs of the first, second, and at least one further counters.

16. The system of claim 15, wherein each pair-wise monitor of the plurality of pair-wise monitors is operable to generate an alarm signal responsive to detection of an invalid sequence of threshold crossings by counts of its respective pair of the counters, and wherein the error detector is further operable to generate an overall alarm signal based on a logical OR of alarm signals generated by the plurality of pair-wise monitors.

17. The system of claim 15, wherein each pair-wise monitor of the plurality of pair-wise monitors is operable to generate an alarm signal responsive to detection of an invalid sequence of threshold crossings by counts of its respective pair of the counters, and wherein the error detector is further operable to identify a failed periodic electrical signal based on alarm signals generated by the plurality of pair-wise monitors.

* * * * *